United States Patent
Dai

(10) Patent No.: US 10,884,283 B2
(45) Date of Patent: Jan. 5, 2021

(54) METHOD FOR MANUFACTURING THIN FILM, THIN FILM MANUFACTURING APPARATUS AND METHOD FOR MANUFACTURING DISPLAY SUBSTRATE

(71) Applicant: BOE TECHNOLOGY GROUP CO., LTD., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 323 days.

(21) Appl. No.: 15/776,886

(22) PCT Filed: Sep. 19, 2017

(86) PCT No.: PCT/CN2017/102176
§ 371 (c)(1),
(2) Date: May 17, 2018

(87) PCT Pub. No.: WO2018/176744
PCT Pub. Date: Oct. 4, 2018

(65) Prior Publication Data
US 2020/0192151 A1    Jun. 18, 2020

(30) Foreign Application Priority Data
Mar. 29, 2017    (CN) .......................... 2017 1 0197331

(51) Int. Cl.
*H01L 51/56*    (2006.01)
*G02F 1/1335*    (2006.01)

(52) U.S. Cl.
CPC ........ *G02F 1/133516* (2013.01); *H01L 51/56* (2013.01)

(58) Field of Classification Search
CPC ... G02F 1/133516; H01L 51/50; H01L 51/52; H01L 51/56
See application file for complete search history.

(56) References Cited

U.S. PATENT DOCUMENTS 9,929,342 B2    3/2018 Dai
2002/0191142 A1*    12/2002 Oguchi ............... G02F 1/16757
349/165
(Continued)

FOREIGN PATENT DOCUMENTS

CN    102765261 A    11/2012
CN    105774279 A    7/2016
(Continued)

OTHER PUBLICATIONS

International Search Report and Written Opinion, including English translation of Box V of the Written Opinion, for International Application No. PCT/CN2017/102176, dated Jan. 3, 2018, 14 pages.
(Continued)

*Primary Examiner* — Mounir S Amer
*Assistant Examiner* — Alexander Belousov
(74) *Attorney, Agent, or Firm* — Westman, Champlin & Koehler, P.A.

(57) ABSTRACT

A method for manufacturing a thin film, a thin film manufacturing apparatus, a display substrate and a method for manufacturing a display substrate are provided. The method for manufacturing the thin film includes: providing a substrate with a pixel defining layer; forming an ink in a pixel region defined by the pixel defining layer; and drying the ink to form the thin film. The drying the ink includes generating a control electric field that enables a solute in the ink to move away from a boundary of the pixel region and move towards a center region of the pixel region under control of the control electric field.

6 Claims, 5 Drawing Sheets

(56) References Cited

U.S. PATENT DOCUMENTS

| | | | |
|---|---|---|---|
| 2016/0179229 A1* | 6/2016 | Ahn | H01L 27/3262 345/173 |
| 2017/0279049 A1 | 9/2017 | Dai | |
| 2018/0320066 A1* | 11/2018 | Pan | C09D 11/36 |

FOREIGN PATENT DOCUMENTS

| | | |
|---|---|---|
| CN | 106953030 A | 7/2017 |
| JP | 2010267428 A | 11/2010 |
| KR | 10-2017-0014206 A | 2/2017 |

OTHER PUBLICATIONS

First Office Action, including Search Report, for Chinese Patent Application No. 201710197331.2, dated Mar. 22, 2018, 11 pages.
Earl H. B. et al., "Suppressing the coffee stain effect: how to control colloidal self-assembly in evaporating drops using electrowetting" Royal Society of Chemistry 2011, www.rcs.org/softmatter DOI: 10.1039/c1sm05183k, Apr. 6, 2011, 5 pages.

* cited by examiner

METHOD FOR MANUFACTURING THIN FILM, THIN FILM MANUFACTURING APPARATUS AND METHOD FOR MANUFACTURING DISPLAY SUBSTRATE

CROSS-REFERENCE TO RELATED APPLICATION

The present application is the U.S. national phase of PCT Application No. PCT/CN2017/102176 filed on Sep. 19, 2017, which claims a priority to Chinese Patent Application No. 201710197331.2 filed on Mar. 29, 2017, the disclosure of which is incorporated in its entirety by reference herein.

TECHNICAL FIELD

The present disclosure relates to the field of displaying technology, and more particularly, to a method for manufacturing a thin film, a thin film manufacturing apparatus and a method for manufacturing a display substrate.

BACKGROUND

In the field of electroluminescent display, thin film depositing for a functional layer such as a light-emitting layer is usually performed using a solution process. The solution process includes but is not limited to ink-jet printing, spin coating, screen printing and transfer printing. The above are all wet film-forming processes and all include a step of removing a solvent and drying a solute to form a wanted thin film through a subsequent drying process. Such drying process for removing the solvent may hugely affect appearance of the formed thin film, and for electroluminescent display elements, dried thin films with bad appearance and poor uniformity may adversely affect life time and display effect of the elements.

Usually, a mixture including the solute and the solvent used in the solution process is called as an ink. When drying the ink, the ink may climb severely at boundaries of pixels due to pinning effect of pixel defining layer (PDL) or Bank. Majority of functional materials such as hole injection layer materials and light-emitting materials are located within pixels at the boundaries of the pixels, where close to the PDL or the Bank; consequently, flatness of the thin film is hard to be ensured, brightnesses of respective elements are not uniform and utilization efficiency of materials is low.

SUMMARY

When forming a thin film in a pixel using a solution process, ink may severely climb at boundaries of the pixel, it is hard to ensure a good flatness of the formed thin film, brightnesses of devices may be ununiform and utilization ratio of material is decreased. In view of the above, the present disclosure provides a method for manufacturing a thin film, a thin film manufacturing apparatus and a method for manufacturing a display panel.

A method for manufacturing a thin film is provided in the present disclosure, including: providing a substrate with a pixel defining layer; forming an ink in a pixel region defined by the pixel defining layer; and drying the ink to form the thin film. The drying the ink includes generating a control electric field that enables a solute in the ink to move away from a boundary of the pixel region towards a center region of the pixel region under control of the control electric field.

Optionally, the substrate is further provided with a conductive pattern. The step of generating the control electric field includes: applying a voltage to the conductive pattern to generate the control electric field.

Optionally, the conductive pattern includes a pixel electrode and a conductive line that is arranged close to the boundary of the pixel region.

Optionally, the conductive line includes at least one of a gate line and a data line.

Optionally, the conductive line is under the pixel defining layer and is covered by the pixel defining layer.

Optionally, in a case that at least one of the solute and a solvent in the ink is cationic, a direction of the control electric field points from the conductive line to the pixel electrode; and in a case that at least one of the solute and the solvent in the ink is anionic, the direction of the control electric field points from the pixel electrode to the conductive line.

Optionally, the pixel region has a long-axis direction and a short-axis direction. The step of generating the control electric field includes: generating a first control electric field to control the solute in the ink to move from two boundaries of the pixel region in the long-axis direction to the center region of the pixel region; and/or generating a second control electric field to control the solute in the ink to move from two boundaries of the pixel region in the short-axis direction to the center region of the pixel region.

The present disclosure further provides a method for manufacturing a display substrate, including: forming a pixel defining layer on a substrate; and forming a thin film in a pixel region defined by the pixel defining layer, where the thin film is manufactured through the above-described method for manufacturing the thin film.

Optionally, the display substrate is an organic light-emitting diode display substrate and the thin film is an organic layer, or the display substrate is a liquid crystal display substrate and the thin film is a color film layer.

The present disclosure further provides a thin film manufacturing apparatus, which is used to perform the above-described method for manufacturing the thin film. The thin film manufacturing apparatus includes: an ink generation device, used to form an ink on a substrate in pixel regions, the substrate being provided with a pixel defining layer and the pixel regions being defined by the pixel defining layer; a drying device, used to dry the ink to form thin films; and a power applying device, used to generate a control electric field during drying the ink, to make a solute in the ink to move away from a predetermined boundary of each pixel region towards a center region of the each pixel region under control of the control electric field.

DETAILED DESCRIPTION OF THE EMBODIMENTS

For clarifying objectives, technical solutions and beneficial effects of the present disclosure, clear and complete descriptions of the technical solutions are given hereinafter based on embodiments in conjunction with drawings. Obviously, described embodiments are merely a part of rather than all embodiments of the present disclosure. Any other embodiments obtained by the ordinary skilled in the art based on described embodiments of the present disclosure fall within scope of the present disclosure.

Figure 1:
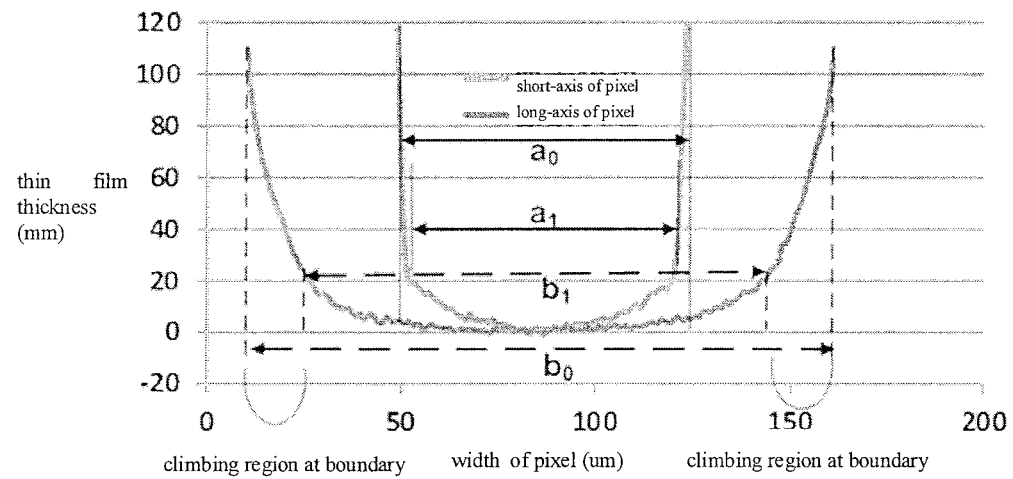
FIG. 1 illustrates a climbing region of a thin film formed through a solution process, the climbing region is located within a pixel of an organic light-emitting diode (OLED) display substrate at a boundary of the pixel.

Reference can be made to FIG. 1, which illustrates a climbing region of a thin film formed through a solution process, the climbing region is located within a pixel of an organic light-emitting diode (OLED) display substrate at a boundary of the pixel. In conjunction with FIG. 2, a size of a theoretical light-emitting region of the pixel of the thin film (i.e., a size of an opening of the pixel) is defined by a0 (in parallel with a short side of the pixel) and b0 (in parallel to a long side of the pixel), while a size corresponding to the thin film having an actual thickness (for example, the thickness of the thin film is 20 nm as shown in FIG. 1) is defined by a1 and b1. In consideration of the light-emitting principle of OLED, it is expected that the actual size of the thin film having any thickness is as similar as possible to the theoretical size, that is, a1 is as similar as possible to a0 and b1 is as similar as possible to b0; in this way, the thin film is of an identical thickness within the light-emitting region. However, such expectation is impossible due to characteristics of wet process. In practical development, it is intended to make a1/a0 and b1/b0 as large as possible and infinitely approaching 1 through adjustment of process and/or ink.

In related technology, a peripheral region of the pixel where has a relatively large thickness is turned into a non-effective light-emitting region by arranging two layers of PDLs, such that a thickness of a thin film of a light-emitting element corresponding to an active light-emitting region can be as uniform as possible. However, the actual light-emitting region is reduced, i.e., the aperture ratio is decreased, which is bad for improvement of element performance.

Figure 3:
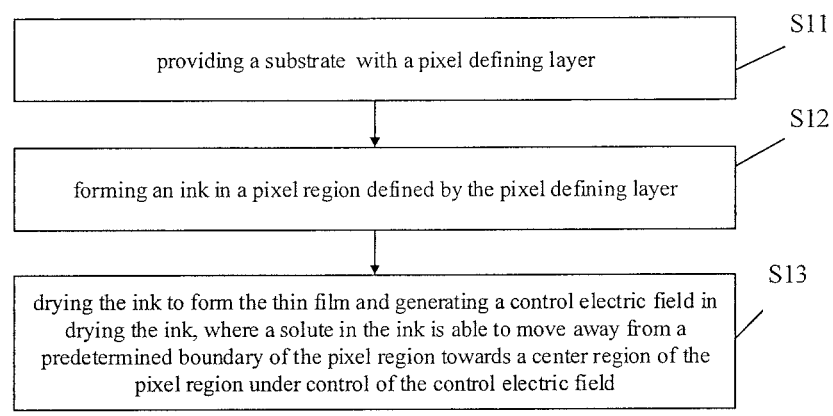
FIG. 3 is a schematic flow chart of a method for manufacturing a thin film according to an embodiment of the present disclosure.

In view of the above technical problems, a method for manufacturing a thin film is provided according to some embodiments of the present disclosure. Reference can be made to FIG. 3, which is a schematic flow chart of a method for manufacturing a thin film according to an embodiment of the present disclosure. The method includes steps S11-S13.

Step S11 includes providing a substrate which is provided with a pixel defining layer (PDL).

Step S12 includes forming an ink in a pixel region defined by the PDL. Specifically, the ink can be framed through a solution process such as ink-jet printing, spin coating, screen printing or transfer printing, the ink is a mixture of a solute and a solvent.

Step S13 includes drying the ink to form a thin film and generating a control electric field in drying the ink, where the solute in the ink is able to move away from a predetermined boundary of the pixel region towards a center region of the pixel region under control of the control electric field.

In the drying process, the solvent volatilizes from the ink and remained solute is dried to form the thin film.

According to the embodiment of the present disclosure, when forming the thin film within the pixel using the ink, the control electric field is generated in the process of drying the ink, and the solute in the ink is controlled to move away from the boundary region of the pixel towards the center region. In this way, the pinning effect of the PDL is resisted and a climbing of the ink at the boundary region of the pixel is alleviated, the thin film has a uniform thickness anywhere within the pixel and the thin film is flat, thereby improving uniformity of luminance of an element having the thin film, improving efficiency and life time of the element and improving utilization ratio of material.

Optionally, according to some embodiments of the present disclosure, the solvent and/or the solute in the ink is a polar system and can move towards a predetermined direction under control of the control electric field. For example, a solvent system having polarity may usually be utilized in making a hole injection layer (HIL) and some illuminant has polarity; hence, for example, some quantum dot illuminant system is suitable for serving as the solvent system.

In the case that the solvent in the ink is the polar system, the control electric field can guide or strengthen polarization of the solvent. Polarized solvent molecules move away from the predetermined boundary of the pixel region towards the center region of the pixel region under control of the control electric field, thereby driving solute molecules to move.

In the case that the solute in the ink is the polar system, the control electric field can directly drive the solute to move away from the predetermined boundary of the pixel region towards the center region of the pixel region.

According to some embodiments of the present disclosure, a direction of the control electric field is determined by a polarity of the solvent and/or the solute (negative ions or positive ions) in the ink, and an intensity of the control electric field is adjustable according to a migration ratio of polarized molecules or ions.

According to some embodiments of the present disclosure, the control electric field for control movement of the solute in the ink can be generated in various ways, which are detailed with examples hereinafter.

According to an optional embodiment of the present disclosure, the substrate is further provided with a conductive pattern. The step of generating the control electric field includes: applying a voltage to the conductive pattern to generate the control electric field. That is, the control electric field is generated using the conductive pattern on the substrate.

Optionally, the conductive pattern may include a pixel electrode and a conductive line which is arranged close to the predetermined boundary of the pixel region. The pixel electrode on the substrate functions as a part of the conductive pattern, thereby saving the cost.

The conductive line may include a gate line and/or a data line. That is, the gate line and/or the data line on the substrate functions as a part of the conductive pattern, thereby saving the cost.

Considering that using the gate line and/or the data line as the conductive line may adversely affect electrical characteristics of a thin film transistor, according to another embodiment of the present disclosure, the conductive line may be made independently from the gate line and the data line.

Optionally, the independently made conductive line may be made of a metallic material to improve conductivity.

Optionally, the independently made conductive line may be arranged under the PDL and covered by the PDL, thereby not affecting the aperture ratio of the pixel.

As mentioned above, the direction of the control electric field is determined by the polarity of the solvent and/or the solute (negative ions or positive ions) in the ink, the direction of the control electric field points from the conductive line to the pixel electrode in the case that the solvent and/or the solute in the ink is cationic, and the direction of the control electric field points from the pixel electrode to the conductive line in the case that the solvent and/or the solute in the ink is anionic.

Obviously, according to some embodiments of the present disclosure, the control electric field may be generated using an independent electric field generation device rather than using the conductive pattern on the substrate.

Figure 2:
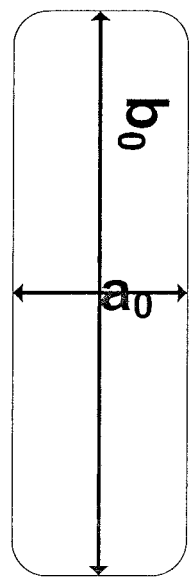
FIG. 2 schematically illustrates a size of a theoretical light-emitting region of a pixel of a thin film.

Usually the pixel region has a rectangle or a rectangle-like shape, including a long-axis and a short-axis. As shown in FIG. 2, the pixel region is rectangle-like, a direction of a long-axis of the pixel region is a direction of b0 and a direction of a short-axis of the pixel region is a direction of a0.

According to some embodiments of the present disclosure, a control electric field controlling the solute to move both in the long-axis direction and the short-axis direction of the pixel region can be generated, or a control electric field controlling the solute to move only in the long-axis direction or only in the short-axis direction can be generated.

The step of generating the control electric field may include:

generating a first control electric field to control the solute in the ink to move from two boundaries of the pixel region in the long-axis direction to the center region of the pixel region; and/or generating a second control electric field to control the solute in the ink to move from two boundaries of the pixel region in the short-axis direction to the center region of the pixel region.

In actual development of solution process, it is found that a proportion a flat part of the formed thin film in the long-axis direction of the pixel region and a proportion of a flat part of the formed thin film in the short-axis direction of the pixel region are usually different. As shown in FIG. 1, a1/a0 hugely differs from b1/b0 under a same drying condition. Under some drying condition, the thin film may achieve good flatness in the short-axis direction of the pixel region (a1/a0 approximates to 1) while the appearance in the long-axis direction is bad (b1/b0 is far away from 1).

In view of the problem that the thin film formed by drying the ink has huge difference in uniformities in the long-axis and the short-axis of the pixel region, according to some embodiments of the present disclosure, a control electric field can be selectively applied to a direction having a relatively severe climbing phenomenon, thereby speeding up movement of the solute in the direction and making the formed thin film flat in the direction.

That is, optionally, the step of generating the control electric field includes: generating a first control electric field to control the solute in the ink to move from two boundaries of the pixel region in the long-axis direction to the center region of the pixel region. That is, only a control electric field for controlling the solute to move in the long-axis direction of the pixel region is formed while no control electric field for controlling the solute to move in the short-axis is formed, thereby solving the huge difference between uniformities of the thin film within the pixel region in the long-axis direction and in the short-axis direction. In addition, since only one direction is applied with the electric field, implementation is simple and there are fewer interference factors.

Optionally, according to some embodiments of the present disclosure, the formed thin film may be an organic layer, applied to an OLED display substrate. The organic layer may include a light-emitting layer, a hole injection layer and so on. The light-emitting layer may be a common light-emitting layer or a quantum dot light-emitting layer.

Alternatively, according to some embodiments of the present disclosure, the formed thin film may be a color film layer, applied to a liquid crystal display substrate. Here, the PDL may be a black matrix.

Procedures of a method for manufacturing a thin film provided in the present disclosure are detailed hereinafter in conjunction with embodiments.

Figure 4:
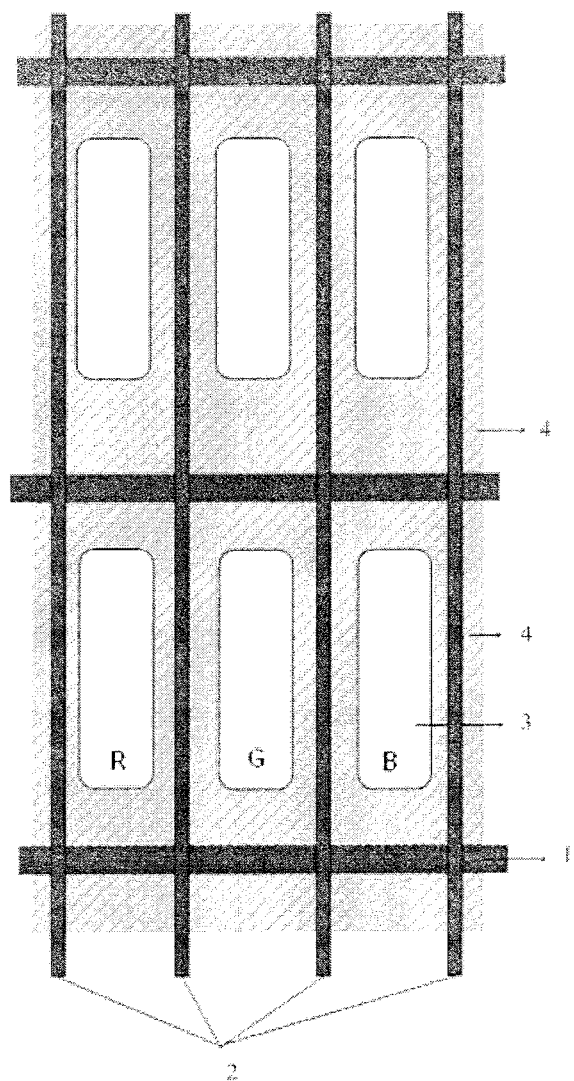
FIG. 4 is a schematic structural diagram of an OLED display substrate according to an embodiment of the present disclosure.
Figure 5:
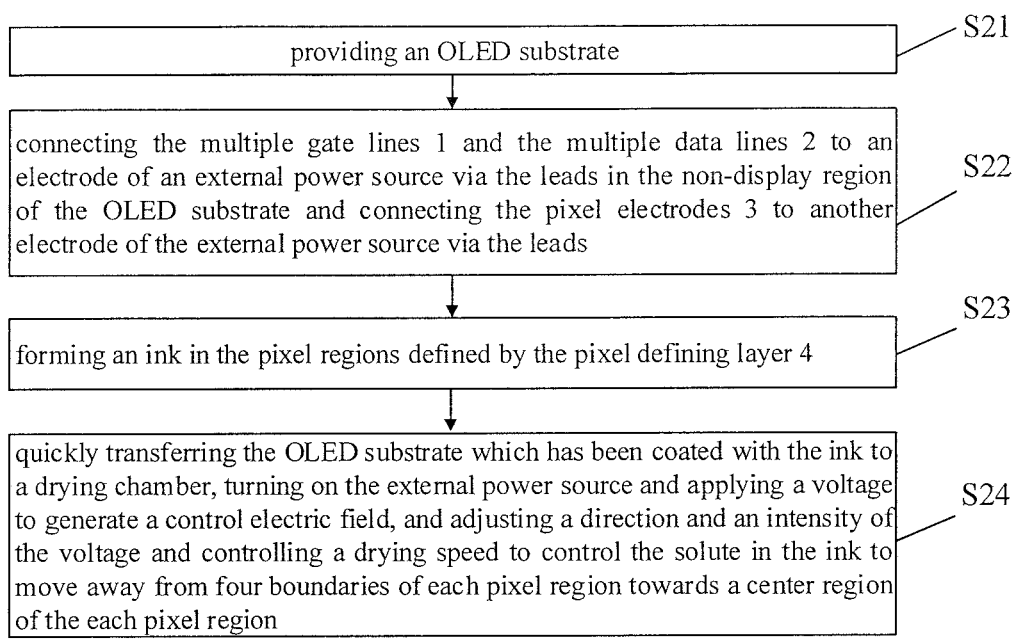
FIG. 5 is a schematic flow chart of a method for forming a thin film on the OLED display substrate in FIG. 4.
Figure 6:
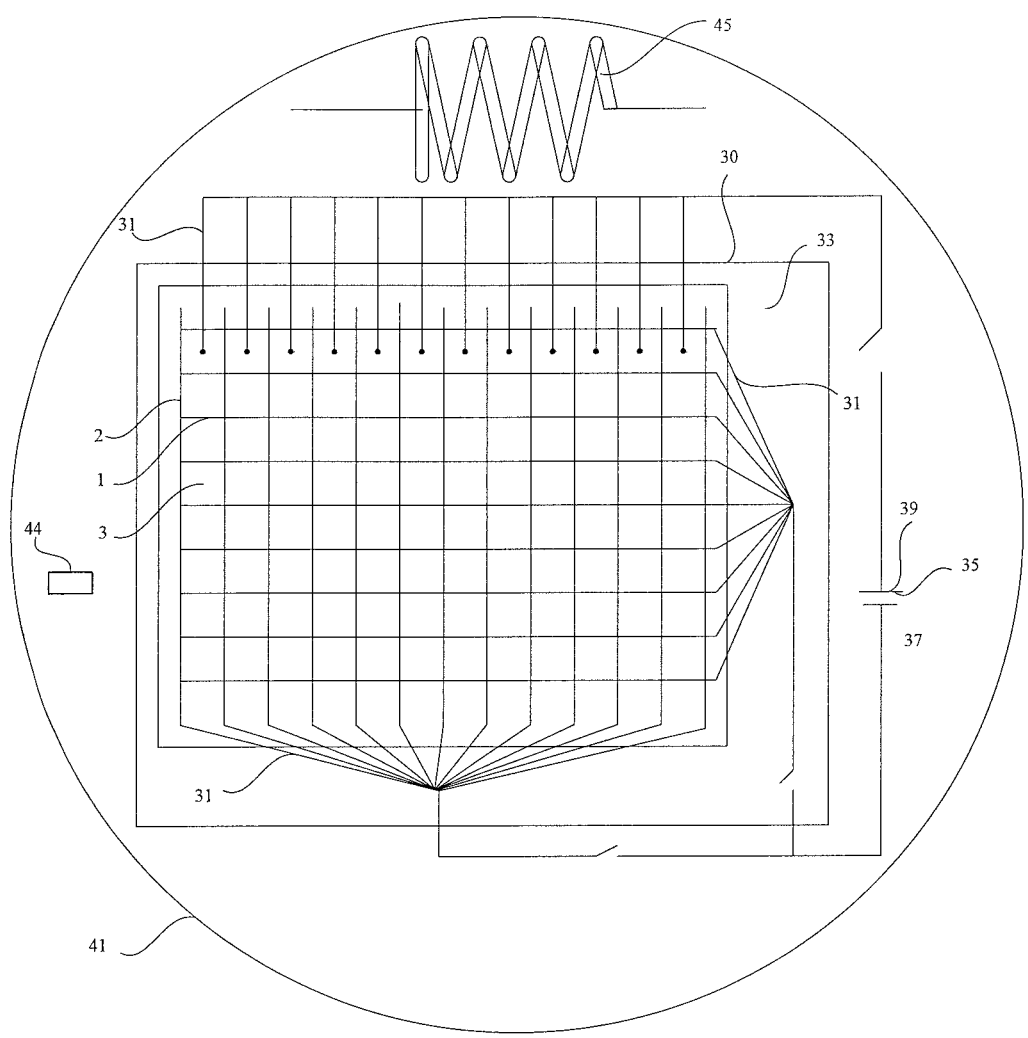
FIG. 6 is a schematic structural diagram of a thin film manufacturing apparatus according to an embodiment of the present disclosure.

With reference to FIG. 4, FIG. 5 and FIG. 6, a method for manufacturing a thin film is provided according to an embodiment of the present disclosure, including steps S21-S24.

Step S21 includes providing an OLED substrate 30, where the OLED substrate 30 is provided with multiple gate lines 1, multiple data lines 2, multiple leads 31 that are arranged in a non-display region of the OLED substrate 30 and used to lead out the multiple gate lines 1 and the multiple data lines 2, pixel electrodes 3 (anodes) and a pixel defining layer 4 that defines multiple pixel regions (regions represented by RGB in FIG. 4).

Step S22 includes connecting the multiple gate lines 1 and the multiple data lines 2 to an electrode 37 of an external power source 35 via the leads 31 in the non-display region 33 of the OLED substrate and connecting the pixel electrodes 3 to another electrode 39 of the external power source 35 via the leads 31.

Step S23 includes forming an ink in the pixel regions defined by the pixel defining layer 4.

Step S24 includes quickly transferring the OLED substrate which has been coated with the ink to a drying chamber 41, turning on the external power source and applying a voltage to generate a control electric field, and adjusting a direction and an intensity of the voltage and controlling a drying speed to control the solute in the ink to move away from four boundaries of each pixel region towards a center region of the each pixel region.

The present disclosure further provides a method for manufacturing a display substrate, including: forming a pixel defining layer on a substrate; and forming a thin film in each pixel region defined by the pixel defining layer, where the thin film can be manufactured through the method for manufacturing the thin film according to any foregoing embodiment.

Optionally, the display substrate may be an organic light-emitting diode display substrate and the thin film is an organic layer. Alternatively, the display substrate is a liquid crystal display substrate and the thin film is a color film layer.

A display substrate is further provided in the present disclosure, which is manufactured by the above-described method for manufacturing the display substrate.

The present disclosure further provides a thin film manufacturing apparatus to perform the method for manufacturing the thin film according to any foregoing embodiment.

The thin film manufacturing apparatus includes: an ink generation device, used to form an ink on a substrate in pixel regions, the substrate being provided with a pixel defining layer and the pixel regions being defined by the pixel defining layer; a drying device, used to dry the ink to form thin films; and a power applying device, used to generate a control electric field during drying the ink, to make a solute in the ink to move away from a predetermined boundary of each pixel region towards a center region of the each pixel region under control of the control electric field.

According to some embodiments, the ink generation device may be embodied as a nozzle 44, the drying device may include a heating unit 45, and the power applying device may be embodies as the external power source 35 and the lead 31 mentioned above.

Unless defined in another way, technical terms or scientific terms utilized in the present disclosure shall be interpreted as common meanings understandable by ordinary skilled in the art to which the present disclosure relates. Terms such as "first" and "second" in the present disclosure do not indicate any sequence, quantity or importance, they are merely for distinguishing different components. In addition, terms like "a" or "an" do not represent any limitation in quantity, but indicates at least one. Terms such as "connected to" and "connected with" are not limited to physical or mechanical connections, but can include electrical connections no matter they are direct or indirect. Terms such as "above", "below", "left" and "right" merely indicate relative position relationships, and in the case that an absolute position of one described object changes, relative position relationships with respect to the described object change correspondingly.

Preferred embodiments of the present disclosure are described hereinabove. It should be noted that the ordinary skilled in the art can make various improvements and polishment without departing from the principle of the disclosure, and those improvements and polishment all fall within the protection scope of the present disclosure.

What is claimed is:

1. A method for manufacturing a display substrate, comprising:
   providing an organic light emitting diode (OLED) substrate; wherein the OLED substrate is provided with a plurality of gate lines, a plurality of data lines, a plurality of leads that are arranged in a non-display region of the OLED substrate and used to lead out the plurality of gate lines and the plurality of data lines, pixel electrodes and a pixel defining layer that defines a plurality of pixel regions;
   connecting the plurality of gate lines and the plurality of data lines to an electrode of an external power source via the leads in the non-display region of the OLED substrate and connecting the pixel electrodes to another electrode of the external power source via the leads;
   coating an ink in the plurality of pixel regions defined by the pixel defining layer;
   transferring the OLED substrate which has been coated with the ink to a drying chamber, turning on the external power source and applying a voltage to generate a control electric field, and adjusting a direction and an intensity of the voltage and controlling a drying speed to control solute in the ink to move away from four boundaries of each pixel region towards a center region of the each pixel region.

2. The method for manufacturing the display substrate according to claim 1, wherein at least one of the solute and a solvent in the ink is cationic, a direction of the control electric field points from gate lines and data lines adjacent each pixel electrode to the each pixel electrode.

3. The method for manufacturing the display substrate according to claim 1, wherein at least one of the solute and a solvent in the ink is anionic, a direction of the control electric field points from each pixel electrode to gate lines and data lines adjacent the each pixel electrode.

4. The method for manufacturing the display substrate according to claim 1, wherein the drying chamber includes a nozzle;
   the coating an ink in the plurality of pixel regions defined by the pixel defining layer, includes:
   using the nozzle to coat the ink in the plurality of pixel regions defined by the pixel defining layer.

5. The method for manufacturing the display substrate according to claim 1, wherein the controlling a drying speed, includes:
   drying the ink to form a thin film.

6. The method for manufacturing the display substrate according to claim 5, wherein the drying chamber includes a heating unit;
   the drying the ink to form a thin film, includes:
   using the heating unit to dry the ink to form the thin film.

* * * * *